United States Patent [19]

Yokoshima et al.

[11] Patent Number: 5,702,820
[45] Date of Patent: Dec. 30, 1997

[54] PHOTO-IMAGING RESIST INK AND CURED PRODUCT THEREOF

[75] Inventors: Minoru Yokoshima, Toride; Tetsuo Ohkubo, Ube; Kazunori Sasahara, Shimonoseki; Yoneji Sato, Hachioji; Yoko Baba, Akigawa, all of Japan

[73] Assignees: Nippon Kayaku Kabushiki Kaisha, Tokyo; Nippon Polytech Corp., Hachioji, both of Japan

[21] Appl. No.: 660,839

[22] Filed: Jun. 10, 1996

Related U.S. Application Data

[62] Division of Ser. No. 374,153, Jan. 17, 1995, abandoned.

[30] Foreign Application Priority Data

Jan. 17, 1994 [JP] Japan .................................. 6-003248

[51] Int. Cl.$^6$ ...................... C08F 283/00; C08G 59/16; B32B 27/38
[52] U.S. Cl. .................... 428/413; 427/510; 430/910; 525/531; 525/533; 525/922; 528/112; 528/115
[58] Field of Search .................... 525/531, 533, 525/922; 528/112, 115; 427/510; 430/910; 428/413

[56] References Cited

U.S. PATENT DOCUMENTS

| | | | |
|---|---|---|---|
| 3,980,483 | 9/1976 | Nishikubo et al. | 96/115 R |
| 4,072,592 | 2/1978 | Due et al. | 204/159.15 |
| 4,097,350 | 6/1978 | Pastor et al. | 204/159.23 |
| 4,918,150 | 4/1990 | Sakakibara et al. | 525/502 |
| 4,933,259 | 6/1990 | Chihara et al. | 430/280 |
| 4,943,516 | 7/1990 | Kamayachi et al. | 430/280 |
| 4,948,700 | 8/1990 | Maeda et al. | 430/280 |
| 5,009,982 | 4/1991 | Kamayachi et al. | 430/280 |
| 5,049,628 | 9/1991 | Nawata et al. | 525/502 |
| 5,100,767 | 3/1992 | Yanagawa et al. | 430/280 |
| 5,102,702 | 4/1992 | Grundke et al. | 427/444 |
| 5,218,061 | 6/1993 | Kajiwara et al. | 525/523 |
| 5,319,060 | 6/1994 | Nishikawa et al. | 528/89 |

FOREIGN PATENT DOCUMENTS

| | | |
|---|---|---|
| 0 306 273 | 3/1989 | European Pat. Off. . |
| 0 346 486 | 12/1989 | European Pat. Off. . |
| 0 362 735 | 4/1990 | European Pat. Off. . |
| 0 539 606 | 5/1993 | European Pat. Off. . |
| 2 580 828 | 4/1986 | France . |
| 27 05 612 | 11/1977 | Germany . |
| 56-40329 | 6/1981 | Japan . |
| 60-208337 | 10/1985 | Japan . |
| 61-59447 | 3/1986 | Japan . |
| 61-243869 | 10/1986 | Japan . |
| 63-312375 | 12/1988 | Japan . |
| 3-223856 | 10/1991 | Japan . |
| 3-247678 | 11/1991 | Japan . |
| 3-250012 | 11/1991 | Japan . |
| 4-170481 | 6/1992 | Japan . |
| 5-32745 | 9/1993 | Japan . |
| 5-32746 | 9/1993 | Japan . |
| 89/07785 | 8/1989 | WIPO . |

OTHER PUBLICATIONS

Copy of the European Search Report dated Aug. 5, 1994.
Copy of the European Search Report dated May 2, 1995.

*Primary Examiner*—Randy Gulakowski
*Attorney, Agent, or Firm*—Nields, Lemack & Dingman

[57] ABSTRACT

There is disclosed a photo-imaging resist ink containing (A) an unsaturated group-containing polycarboxylic acid resin which is a reaction product of (c) succinic anhydride with an additive reaction product of (a) an epoxy resin with (b) an unsaturated group-containing monocarboxylic acid, wherein (a) the epoxy resin is represented by the following formula (1):

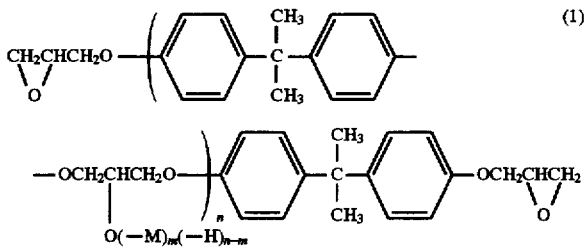

wherein M stands for

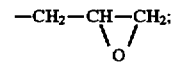

n is at least 1 on the average; and m is 1 to n on the average. The resist ink is excellent in developability and photosensitivity, while the cured product thereof is excellent in flex resistance and folding resistance, and well satisfactory in adhesion, pencil hardness, solvent resistance, acid resistance, heat resistance, etc.

10 Claims, No Drawings

PHOTO-IMAGING RESIST INK AND CURED PRODUCT THEREOF

This application is a continuation of application Ser. No. 08/374,153 filed Jan. 17, 1995, now abandoned.

BACKGROUND OF THE INVENTION

1. Field of the Invention

The present invention relates to a photo-imaging resist ink and a cured product thereof. More particularly, the present invention relates to a photo-imaging resist ink usable for a solder resist, a plating resist, etc. and developable with a dilute alkaline aqueous solution in the course of production of a flexible printed circuit board and a thin pliable rigid circuit board, and a cured product thereof excellent in flex resistance, folding resistance, adhesion, chemical resistance, heat resistance, etc.

2. Description of the Prior Art

Ultraviolet-curing compositions have recently been increasingly used in various fields for reasons of resources saving, energy saving, improved workability, improved productivity, etc. For the same reasons, ultraviolet-curing compositions have begun to be used, instead of conventional thermosetting compositions, for various inks such as a solder resist ink and a marking ink in the field of manufacture of printed circuit boards. For example, Japanese Patent Publication No. 40,329/1981 discloses a curable photosensitive material comprising a reaction product of an epoxy resin-photopolymerizable α,β-unsaturated carboxylic acid adduct with a dibasic carboxylic acid anhydride, a photopolymerizable monomer and a photopolymerization initiator. Solder resists, which have heretofore been used in polyimide substrates called flexible printed circuit boards, are of a type wherein a polyimide film called a cover lay film is cut with a cutting die produced according to a pattern and then adhered to a substrate with an adhesive, or of a type wherein a flexibility-imparted ultraviolet-curing or thermosetting solder resist ink is applied on a substrate according to screen printing. Solder resists used in general printed circuit boards called rigid circuit boards have also been increasingly required to have a high accuracy and a high resolution in order to materialize a higher packaging density in keeping with the advance of electronics. Since accuracy of a pattern cannot be secured according to conventional screen printing, a liquid photoresist method was proposed, which is now adopted at a rate of at least 50%.

A higher packaging density has recently been required in the field of flexible printed circuit boards as well. Some conventional liquid solder photoresists, though capable of securing accuracy of a pattern, are rigid in the form of a coating film and poor in adhesion to polyimides to fail to secure sufficient flexibility and folding resistance though they can secure an accuracy of a pattern, while the other conventional liquid solder photoresists, though flexible to a certain degree, are poor in workability and insufficient in chemical resistance and heat resistance. Thus, they involve problems in any case.

SUMMARY OF THE INVENTION

As a result of intensive investigations with a view to solving the foregoing problems, the inventors of the present invention have found out that a resist ink developable with a dilute alkaline aqueous solution and capable of forming a cured coating film excellent in flexibility, folding resistance, adhesion, chemical resistance, heat resistance, etc. can be prepared by using a specific polycarboxylic acid resin.

More specifically, the present invention provides:

(1) a photo-imaging resist ink containing (A) an unsaturated group-having polycarboxylic acid resin which is a reaction product of (c) succinic anhydride with an additive reaction product of (a) an epoxy resin with (b) an unsaturated group-having monocarboxylic acid, wherein (a) the epoxy resin is represented by the following formula (1):

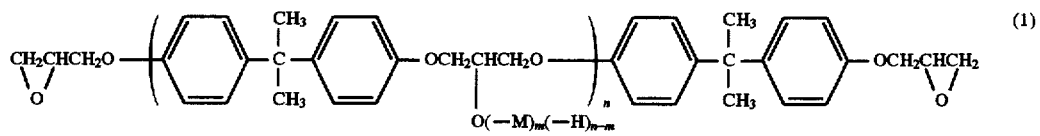

wherein M stands for

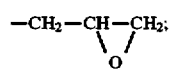

n is at least 1 on the average; and m is 1 to n on the average;

(2) a photo-imaging resist ink as set forth in (1) above, wherein n is 1 to 10 on the average;

(3) a photo-imaging resist ink as set forth in (1) above, wherein (A) the unsaturated group-having polycarboxylic acid resin is prepared by reacting (a) the epoxy resin with 0.8 to 1.3 mol, per equivalent of the epoxy groups of (a) the epoxy resin, of (b) the unsaturated group-having monocarboxylic acid to form the additive reaction product, and subsequently reacting the above-mentioned additive reaction product with 0.1 to 0.9 equivalent, per equivalent of the hydroxyl groups of the additive reaction product, of (c) succinic anhydride;

(4) a photo-imaging resist ink as set forth in (1) or (3) above, wherein the acid value of (A) the unsaturated group-having polycarboxylic acid resin is 40 to 110 mg·KOH/g;

(5) a photo-imaging resist ink as set forth in (1) above, wherein the amount of (A) the unsaturated group-having polycarboxylic acid resin is 10 to 80 wt. % based on the total amount of the resist ink;

(6) a photo-imaging resist ink as set forth in (1) above, wherein (b) the unsaturated group-having monocarboxylic acid is a member selected from the group consisting of acrylic acid, acrylic acid dimer, methacrylic acid, β-styrylacrylic acid, β-furfurylacrylic acid, crotonic acid, α-cyanocinnamic acid, cinnamic acid, half esters as reaction products of a saturated or unsaturated dibasic acid anhydride with a (meth)acrylate derivative having one hydroxyl group per molecule, half esters as reaction products of a saturated or unsaturated dibasic acid with an unsaturated group-having monoglycidyl compound, and mixtures thereof;

(7) a photo-imaging resist ink as set forth in (1) above, wherein (b) the unsaturated group-having monocarboxylic acid is acrylic acid;

(8) a photo-imaging resist ink comprising (A) an unsaturated group-having polycarboxylic acid resin as set forth in (1) above, (B) a photopolymerization initiator, (C) a diluent, and (D) a curing component;

(9) a photo-imaging resist ink as set forth in (1) or (8) above, which is a solder resist ink;

(10) a cured product of a photo-imaging resist ink as set forth in (1) or (8) above; and

(11) a process for curing a photo-imaging resist ink, comprising coating a substrate with a photo-imaging resist ink as set forth in (1) or (8) above, and subsequently irradiating the coated surface of the substrate with ultraviolet light.

The unsaturated group-having polycarboxylic acid resin (A) to be used in the present invention can be prepared by reacting the epoxy resin (a) of the above-mentioned formula (1) with the unsaturated group-having monocarboxylic acid (b) to synthesize an additive reaction product (I), and subsequently reacting the product (I) with succinic anhydride. Specifically, in the first reaction, hydroxyl groups are formed through an addition reaction of the epoxy residues of the epoxy resin (a) with the carboxyl residues of the monocarboxylic acid (b). In the second reaction, the polycarboxylic acid resin (A) is formed through an esterification reaction of the above-mentioned hydroxyl groups with succinic anhydride.

In the epoxy resin (a) of the aforementioned formula (1), n is at least 1 on the average, preferably 1 to 10 on the average, further preferably 3 to 5 on the average; and m is 1 to n on the average, preferably 1 to 0.8n on the average. The epoxy equivalent of the epoxy resin (a) is desirably about 200 to about 600, preferably about 250 to about 500, further preferably about 270 to about 450. The epoxy resin (a) can be prepared by reacting the alcoholic hydroxyl group(s) of a compound represented by the following formula (2):

The alkali metal hydroxide may be used either in a solid form or in the form of an aqueous solution thereof. When it is used in the form of an aqueous solution thereof, the reaction may be effected under ordinary or reduced pressure while distilling water off from the reaction system. The reaction temperature is preferably 30° to 100° C. When the reaction temperature is lower than 30° C., the reaction is slowed down to require a prolonged reaction time. When the reaction temperature exceeds 100° C., a side reaction unfavorably occurs to a great extent.

The residues of the epihalohydrin and dimethyl sulfoxide may be distilled off under reduced pressure after the completion of the reaction, and the formed resin may then be dissolved in an organic solvent and subjected to a dehydrohalogenation reaction with the alkali metal hydroxide. Alternatively, the reaction mixture may be washed with water after the completion of the reaction to separate therefrom a by-product salt and dimethyl sulfoxide, the excess of the epihalohydrin may be distilled off from the remaining oil layer under reduced pressure, and the formed resin may then be dissolved in an organic solvent and subjected to a dehydrohalogenation reaction with the alkali metal hydroxide. Usable examples of the organic solvent include methyl isobutyl ketone, benzene, toluene, and xylene, among which methyl isobutyl ketone is preferred. Additionally stated, these organic solvents may be used either alone or in mixture. The epoxy resin (a) prepared according to the foregoing method is preferably such that 1 to n, preferably 1 to 0.8n, of the number n of the hydroxyl group(s) of the compound of the formula (2) are epoxidized. Additionally

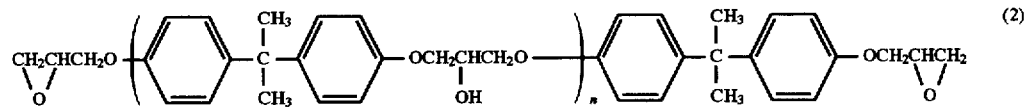

wherein n is at least 1 on the average, with an epihalohydrin such as epichlorohydrin preferably in the presence of dimethyl sulfoxide. The amount of the epihalohydrin to be used may be at least 1 equivalent per equivalent of the alcoholic hydroxyl group(s) of the compound of the formula (2). When it exceeds 15 equivalents per equivalent of the alcoholic hydroxyl group(s) of the compound of the formula (2), however, the effect of increasing it is observed substantially no more, while the volumetric efficiency is deteriorated.

The amount of dimethyl sulfoxide, if used, is preferably 5 wt. % to 300 wt. % based on the compound of the formula (2). When it is smaller than 5 wt. % based on the compound of the formula (2), the reaction of the alcoholic hydroxyl group(s) of the compound of the formula (2) with the epihalohydrin is slowed down to require a longer reaction time. On the other hand, when it exceeds 300 wt. % based on the compound of the formula (2), the effect of increasing it is observed substantially no more, while the volumetric efficiency is deteriorated.

An alkali is used in effecting the reaction. An alkali metal hydroxide is preferred as the alkali. Usable examples of the alkali metal hydroxide include caustic soda, caustic potash, and lithium hydroxide, among which caustic soda is preferable. Alternatively, calcium hydroxide may be used. The amount of the alkali to be used may be around 1 equivalent per equivalent of the alcoholic hydroxyl group(s) to be epoxidized of the compound of the formula (2). When all of the alcoholic hydroxyl group(s) of the compound of the formula (2) is epoxidized, an excessive amount of the alkali may be used. When it exceeds 2 equivalents per equivalent of the alcoholic hydroxyl group(s) of the compound of the formula (2), however, a little polymerization tends to occur.

stated, the compound of the formula (2) is commercially sold, for example, under the name of Epikote 1001, 1002, 1003, 1004, etc. by Yuka Shell Epoxy K.K.

The aforementioned unsaturated group-having monocarboxylic acid (b) will now be described. Specific examples of the monocarboxylic acid (b) include acrylic acid, acrylic acid dimer, methacrylic acid, β-styrylacrylic acid, β-furfurylacrylic acid, crotonic acid, α-cyanocinnamic acid, cinnamic acid, and the following half esters <1> and <2>. These monocarboxylic acids (b) may be used either alone or in mixture. An especially preferred monocarboxylic acid is acrylic acid.

<1> An equimolar reaction product of a saturated or unsaturated dibasic acid anhydride with a (meth)acrylate derivative having one hydroxyl group per molecule.

<2> An equimolar reaction product of a saturated or unsaturated dibasic acid with an unsaturated group-having monoglycidyl compound.

Examples of the saturated or unsaturated dibasic acid anhydride in <1> above include succinic anhydride, maleic anhydride, phthalic anhydride, tetrahydrophthalic anhydride, hexahydrophthalic anhydride, methylhexahydrophthalic anhydride, methyltetrahydrophthalic anhydride, itaconic anhydride, and methylendomethylenetetrahydrophthalic anhydride. Examples of the (meth)acrylate derivative having one hydroxyl group per molecule in <1> above include hydroxyethyl (meth)acrylate, hydroxypropyl (meth)acrylate, hydroxybutyl (meth)acrylate, polyethylene glycol mono(meth)acrylate, glycerol di(meth)acrylate, trimethylolpropane di(meth)acrylate, pentaerythritol tri(meth) acrylate, dipentaerythritol penta(meth)acrylate, and (meth) acrylate of phenyl glycidyl ether.

Examples of the saturated or unsaturated dibasic acid in <2> above include succinic acid, maleic acid, adipic acid, phthalic acid, tetrahydrophthalic acid, hexahydrophthalic acid, itaconic acid, and fumaric acid. On the other hand, examples of the unsaturated group-having monoglycidyl compound in <2> above include glycidyl (meth)acrylate,

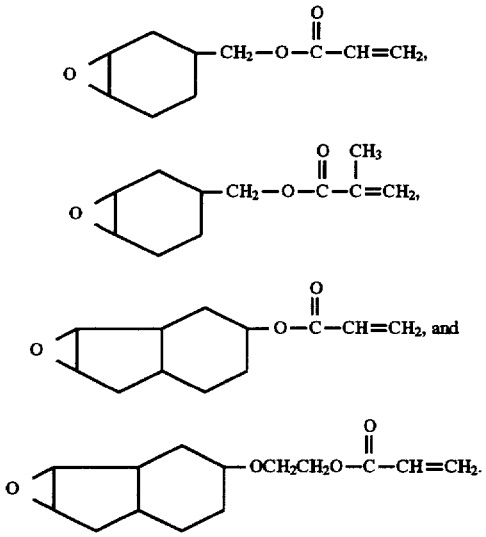

The reaction of the epoxy resin (a) of the aforementioned formula (1) with the unsaturated group-having monocarboxylic acid (b) for preparing the aforementioned reaction product (I), will now be described. This reaction is preferably effected at such a ratio that about 0.8 to about 1.3 mol, especially preferably about 0.9 to about 1.1 mol, of the unsaturated group-having monocarboxylic acid (b) is used per equivalent of the epoxy resin (a) of the formula (1). In the reaction, an organic solvent or a reactive monomer is preferably used as the diluent. Examples of the organic solvent include ketones such as methyl ethyl ketone and cyclohexanone; aromatic hydrocarbons such as toluene, xylene, and tetramethylbenzene; glycol ethers such as dipropylene glycol dimethyl ether and dipropylene glycol diethyl ether; esters such as ethyl acetate, butyl acetate, butyl cellosolve acetate, and Carbitol acetate; aliphatic hydrocarbons such as octane and decane; and petroleum solvents such as petroleum ether, petroleum naphtha, hydrogenated petroleum naphtha, and solvent naphtha. Examples of the reactive monomer include Carbitol (meth)acrylate, phenoxyethyl (meth)acrylate, pentaerythritol tetra(meth) acrylate, trimethlolpropane tri(meth)acrylate, tris (hydroxyethyl)isocyanurate tri(meth)acrylate, and dipentaerythritol hexa(meth)acrylate. Further, in order to accelerate the reaction, a catalyst is preferably used, examples of which include triethylamine, benzyldimethylamine, methyltriethylammonium chloride, benzyltrimethylammonium bromide, benzyltrimethylammonium iodide, triphenylphosphine, triphenylstibine, chromium octanoate, and zirconium octanoate. The amount of the catalyst that may be used is preferably 0.1 to 10 wt. % based on the mixture of the starting materials. Further, in order to inhibit polymerization during the course of the reaction, a polymerization inhibitor is preferably used, examples of which include hydroquinone, methylhydroquinone, hydroquinone monomethyl ether, catechol, and pyrogallol. The amount of the polymerization inhibitor that may be used is preferably 0.01 to 1 wt. % based on the mixture of the starting materials. The reaction temperature is preferably 60° to 150° C. On the other hand, the reaction time is preferably 5 to 60 hours. According to the foregoing procedure, the product (I) of the epoxy resin (a) with the unsaturated group-having monocarboxylic acid (b) can be obtained.

The reaction of the product (I) with (c) succinic anhydride for preparing the unsaturated group-having polycarboxylic acid resin (A) will now be described. In this reaction, (c) succinic anhydride is preferably reacted in an amount of 0.1 to 0.9 equivalent per equivalent of the hydroxyl groups of the product (I). The reaction temperature is preferably 60° to 150° C., and the reaction time is preferably 1 to 10 hours.

The acid value (mg·KOH/g) of the resulting unsaturated group-having polycarboxylic acid resin (A) is preferably 40 to 110, especially preferably 50 to 100.

The amount of the unsaturated group-having polycarboxylic acid resin (A) to be contained in the resist ink of the present invention is preferably 10 to 80 wt. %, especially preferably 15 to 60 wt. % based on the resist ink.

The photo-imaging resist ink of the present invention is usually admixed with the photopolymerization initiator (B), the diluent (C), the curing component (D), etc.

The kind of photopolymerization initiator (B) is not particularly restricted in so far as it can initiate polymerization in cooperation with light. Examples of the photopolymerization initiator (B) include benzoins such as benzoin, benzoin methyl ether, and benzoin isopropyl ether; acetophenones such as acetophenone, 2,2-dimethoxy-2-phenylacetophenone, 2,2-diethoxy-2-phenylacetophenone, 1,1-dichloroacetophenone, 1-hydroxycyclohexyl phenyl ketone, 2-methyl-1-[4-(methylthio)phenyl]-2-morpholinopropan-1-one, and N,N-dimethylaminoacetophenone; anthraquinones such as 2-methylanthraquinone, 2-ethylanthraquinone, 2-tert-butylanthraquinone, 1-chloroanthraquinone, 2-amylanthraquinone, and 2-aminoanthraquinone; thioxanthones such as 2,4-dimethylthioxanthone, 2,4-diethylthioxanthone, 2-chlorothioxanthone, and 2,4-diisopropylthioxanthone; ketals such as acetophenone dimethyl ketal, and benzyl dimethyl ketal; benzophenones such as benzophenone, methylbenzophenone, 4,4'-dichlorobenzophenone, 4,4'-bis-diethylaminobenzophenone, Michler's ketone, and 4-benzoyl-4'-methyldiphenyl sulfide; and 2,4,6-trimethylbenzoyldiphenylphosphine oxide. They may be used either alone or in mixture.

Further, the photopolymerization initiator (B) may be used in combination with at least one photosensitizer, examples of which include tertiary amines such as ethyl N,N-dimethylaminobenzoate, isoamyl N,N-dimethylaminobenzoate, pentyl 4-dimethylaminobenzoate, triethylamine, and triethanolamine. Preferred examples of such combination include a combination of 2-methyl-1-[4-(methylthio)phenyl]-2-morpholinopropan-1-one (IRGACURE 907 manufactured by CIBA-GEIGY Ltd.) with 2,4-diethylthioxanthone (KAYACURE DETX manufactured by Nippon Kayaku Co., Ltd.), 2-isopropylthioxanthone, or 4-benzoyl-4'-methyldiphenyl sulfide. When the photosensitizer is used in combination with the photopolymerization initiator (B), the amount of the photosensitizer is desirably about 10 to about 300 parts by weight, preferably about 50 to about 200 parts by weight, per 100 parts by weight of the photopolymerization initiator (B). The weight proportion of the photopolymerization initiator (B) to the resist ink of the present invention is preferably 0.5 to 20 wt. %, especially preferably 1 to 10 wt. %.

The aforementioned diluent (C) is used in the case where the polycarboxylic acid resin (A) must be made easily applicable on a substrate. Specifically, for example, an organic solvent(s) and/or a photopolymerizable monomer(s) may be used as the diluent (C). Representative examples of the organic solvent include ketones such as methyl ethyl ketone and cyclohexanone; aromatic hydrocarbons such as toluene, xylene, and tetramethylbenzene; glycol ethers such as methyl cellosolve, butyl cellosolve, methyl carbitol, butyl carbitol, propylene glycol monomethyl ether, dipropylene glycol monoethyl ether, dipropylene glycol diethyl ether, and triethylene glycol monoethyl ether; esters such as ethyl acetate, butyl acetate, butyl cellosolve acetate, and Carbitol acetate; alcohols such as ethanol, propanol, ethylene glycol, and propylene glycol; aliphatic hydrocarbons such as octane and decane; and petroleum solvents such as petroleum ether, petroleum naphtha, hydrogenated petroleum naphtha, and solvent naphtha. On the other hand, representative examples of the photopolymerizable monomer include hydroxyalkyl (meth)acrylates such as 2-hydroxyethyl (meth)acrylate and 2-hydroxypropyl (meth)acrylate; mono- or di-(meth) acrylates of glycols such as ethylene glycol, methoxytetraethylene glycol, and polyethylene glycol; (meth) acrylamides such as N,N-dimethyl(meth)acrylamide and N-methylol(meth)acrylamide; aminoalkyl (meth)acrylates such as N,N-dimethylaminoethyl (meth)acrylate; polyvalent (meth)acrylates of a polyhydric alcohol such as hexanediol, trimethylolpropane, pentaerythritol, ditrimethylolpropane, dipentaerythritol or tris-hydroxyethyl isocyanurate, or an additive reaction product thereof with ethylene oxide or propylene oxide; (meth)acrylates of an additive reaction product of a phenol with ethylene oxide or propylene oxide, such as phenoxyethyl (meth)acrylate or polyethoxydi(meth) acrylate of bisphenol A; (meth)acrylates of a glycidyl ether such as glycerol diglycidyl ether, trimethylolpropane triglycidyl ether or triglycidyl isocyanurate; ε-caprolactone-modified (meth)acrylates such as caprolactone-modified tris (acryloxyethyl) isocyanurate; and melamine (meth)acrylate. Where the diluent (C) is used, those as mentioned above may be used either alone or in mixture. The amount of the diluent (C) that may be contained in the resist ink of the present invention is preferably 5 to 80 wt. %, especially preferably 10 to 70 wt. %, based on the resist ink.

The purpose of using the diluent (C) is to dilute therewith the component (A) to thereby make it easily applicable while at the same time enhancing the photopolymerizability thereof in the case of the photopolymerizable monomer, or to dissolve therein and dilute therewith the component (A) to thereby make it applicable in a liquid state and dryable for formation of a coating film thereof in the case of the organic solvent. Accordingly, the mode of exposure to be employed may be either a contact mode wherein a photomask is brought into contact with a coating film of the resist ink, or a non-contact mode in accordance with the kind of diluent used.

The kind of the curing component (D) that may be used is not particularly restricted in so far as it can be cured in itself by heating, ultraviolet light irradiation or the like, or can be reacted with the hydroxyl groups, carboxyl groups, etc. of the component (A) by heating, ultraviolet light irradiation or the like. Specific examples of the curing component (D) include epoxy compounds having at least one epoxy group per molecule, melamine derivatives, urea compounds, bisphenol A compounds, and oxazoline compounds. Examples of the epoxy compounds having at least one epoxy group per molecule include EPIKOTE 1009 and 1031 manufactured by Yuka Shell Epoxy K.K.; EPICLON N-3050 and N-7050 manufactured by Dainippon Ink & Chemicals, Inc.; bisphenol A epoxy resins DER-642U, DER-673MF, etc. manufactured by Dow Chemical Japan Ltd.; hydrogenated bisphenol A epoxy resins ST-2004, ST-2007, etc. manufactured by Thoto Kasei Co., Ltd.; bisphenol F epoxy resins YDF-2004, YDF-2007, etc. manufactured by Thoto Kasei Co., Ltd.; SR-BBS and SR-TBA-400 manufactured by Sakamoto Yakuhin Kogyo K.K.; brominated bisphenol A epoxy resins YDB-600, YDB-715, etc. manufactured by Thoto Kasei Co., Ltd.; novolak epoxy resins EPPN-201, EOCN-103, EOCN-1020, BREN, etc. manufactured by Nippon Kayaku Co., Ltd.; bisphenol A novolak epoxy resins EPICLON N-880, etc. manufactured by Dainippon Ink & Chemicals, Inc.; amino group-having epoxy resins YL-931, YL-933, etc. manufactured by Yuka Shell Epoxy K.K.; EPICLON TSR-601 manufactured by Dainippon Ink & Chemicals, Inc.; rubber-modified epoxy resins R-1415-1, etc. manufactured by A.C.R. Co., Ltd.; EBPS-200 manufactured by Nippon Kayaku Co., Ltd.; bisphenol S epoxy resins EPICLON EXA-1514, etc. manufactured by Dainippon Ink & Chemicals, Inc.; diglycidyl terephthalate BLEMMER DGT, etc. manufactured by Nippon Oil & Fats Co., Ltd.; triglycidyl isocyanurate TEPIC, etc. manufactured by Nissan Chemical Industries, Ltd.; bixylenol epoxy resins YX-4000, etc. manufactured by Yuka Shell Epoxy K.K. bisphenol epoxy resins YL-6056, etc. manufactured by Yuka Shell Epoxy K.K.; and alicyclic epoxy resins CELLOXIDE 2021, etc. manufactured by Daicel Chemical Industries. Ltd. Examples of the melamine derivatives include hexamethoxymelamine, hexabutoxylated melamine, and condensed hexamethoxymelamine. Examples of the urea compounds include dimethylol urea. Examples of the bisphenol A compounds include tetramethylol bisphenol A.

The purpose of using the curing component (D) is to improve the solder resist in various properties such as adhesion, heat resistance, and plating resistance. Where the curing component (D) is used, those as mentioned above may be used either alone or in mixture. The amount of the curing component (D) that may be contained in the resist ink of the present invention is preferably 1 to 50 wt. %, especially preferably 3 to 45 wt. %, based on the resist ink.

Where an epoxy compound is used as the curing component (D), it is preferably used in combination with an epoxy resin-curing agent in order to further improve the properties such as adhesion, chemical resistance, and heat resistance. Specific examples of the epoxy resin-curing agent include imidazole derivatives 2MZ, 2E4MZ, $C_{11}Z$, $C_{17}Z$, 2PZ, 1B2MZ, 2MZ-CN, 2E4MZ-CN, $C_{11}Z$-CN, 2PZ-CN, 2PHZ-CN, 2MZ-CNS, 2E4MZ-CNS, 2PS-CNS, 2MZ-AZINE, 2E4MZ-AZINE, $C_{11}Z$-AZINE, 2MA-OK, 2P4MHZ, 2PHZ, 2P4BHZ (trade names), etc. manufactured by Shikoku Chemicals Corp.; guanamines such as acetoguanamine and benzoguanamine; polyamines such as diaminodiphenylmethane, m-phenylenediamine, m-xylylenediamine, diaminodiphenyl sulfone, dicyandiamide, urea, urea derivatives, melamine, and polybasic hydrazides; salts thereof with an organic acid and/or an epoxy adducts thereof; amine complexes of boron trifluoride; triazine derivatives such as ethyldiamino-S-triazine, 2,4-diamino-S-triazine, and 2,4-diamino-6-xylyl-S-triazine; tertiary amines such as trimethylamine, triethanolamine, N,N-dimethyloctylamine, N-benzyldimethylamine, pyridine, N-methylmorpholine, hexa(N-methyl)melamine, 2,4,6-tris(dimethylaminophenol), tetramethylguanidine, and m-aminophenol; polyphenols such as polyvinylphenol, brominated polyvinylphenol, phenolic novolak, and alkylphenolic novolaks; organophosphines such as tributylphosphine, triphenylphosphine, and tris-2- cyanoethylphosphine; phosphonium salts such as tri-n-butyl-(2,5-dihydroxyphenyl)phosphonium bromide and hexadecyltributylphosphonium chloride; quaternary ammonium salts such as benzyltrimethylammonium chloride and phenyltributylammonium chloride; polybasic acid anhydrides as mentioned hereinbefore; cationic photopolymerization catalysts such as diphenyliodonium tetrafluoroborate, triphenylsulfonium hexafluoroantimonate, 2,4,6-triphenylthiopyrilium hexafluorophosphate, IRGA-CURE 261 manufactured by CIBA-GEIGY Japan Ltd., and ADEKA OPTOMER SP-170 manufactured by Asahi Denka Kogyo K.K.; a styrene-maleic anhydride resin; an equimolar reaction product of phenyl isocyanate with dimethylamine; and equimolar reaction products of an organic polyisocyanate such as tolylene diisocyanate or isophorone diisocyanate with dimethylamine. These known and commonly used curing agent or curing promoters usable as the epoxy resin-curing agent may be used either alone or in mixture. The amount of the epoxy resin-curing agent that may be used is preferably 0.01 to 25 parts by weight, especially preferably 0.1 to 15 parts by weight, per 100 parts by weight of the aforementioned epoxy compound as the curing component (D).

In the resist ink of the present invention, a known and commonly used inorganic filler may further be used, if necessary, for the purpose of improving the properties such as adhesion and hardness. Examples of the inorganic filler include barium sulfate, barium titanate, a silicon oxide powder, finely divided silicon oxide, amorphous silica, talc, clay, magnesium carbonate, calcium carbonate, aluminum oxide, aluminum hydroxide, and a mica powder. The amount of the inorganic filler that may be used is preferably 0 to 60 wt. %, especially preferably 5 to 40 wt. %, based on the resist ink of the present invention.

If necessary, further use may be made of a known and commonly used colorant such as phthalocyanine blue, phthalocyanine green, Iodine Green, disazo yellow, Crystal Violet, titanium oxide, carbon black, and/or Naphthalene Black; a known and commonly used polymerization inhibitor such as hydroquinone, hydroquinone monomethyl ether, tert-butylcatechol, pyrogallol, and/or phenothiazine; a known and commonly used thickener such as asbestos, orben, bentonite, and/or montmorillonite; and/or a known and commonly used additive such as a silicone, fluorine-containing or polymeric defoaming agent and/or leveling agent, and/or an imidazole, thiazole, triazole or silane coupling agent adhesion improver.

In so far as the various properties of the solder resist is not adversely affected, use may be made of a known and commonly used binder resin(s) such as a copolymer of an ethylenically unsaturated compound(s) such as acrylic ester (s) and/or a polyester resin synthesized from a polyhydric alcohol(s) and a polybasic acid compound(s), and a photopolymerizable oligomer(s) such as a polyester (meth) acrylate, a polyurethane (meth)acrylate and/or epoxy (meth) acrylate.

Further, water may be added to the resist ink of the present invention in order to lower the flammability thereof. Where water is added, the carboxyl groups of the component (A) are preferably formed into a salt with an amine such as trimethylamine or triethylamine, or a (meth)acrylate compound having a tertiary amino group such as N,N-dimethylaminoethyl (meth)acrylate, N,N-dimethylaminopropyl (meth)acrylamide, N,N-dimethyl (meth)acrylamide, acryloylmorpholine, N-isopropyl (meth) acrylamide or N-methylolacrylamide to make the component (A) dissolvable in water.

The resist ink of the present invention can be obtained by blending the foregoing blending components together preferably at the foregoing proportions and homogeneously mixing them with a roll mill or the like.

Other use applications of the resist ink of the present invention include a paint, a coating, and an adhesive. The resist ink of the present invention may be cured, for example, according to the following procedure to obtain a cure product thereof. Specifically, the resist ink of the present invention is applied on a substrate by screen printing, spray coating, roll coating, electrostatic coating, curtain coating, or the like to form a coating film having a thickness of 10 to 160 µm, which is dried at 60° to 110° C., then brought into direct contact with a negative film (which may alternatively be placed on the coating film in a non-contact state), and subsequently irradiated with ultraviolet light. The unexposed portions of the coating film are dissolved away (development) with a dilute aqueous solution of an alkali (e.g., a 0.5 to 2% aqueous solution of sodium carbonate). Thereafter, the remaining coating film is sufficiently cured through further irradiation thereof with ultraviolet light and/or heating (e.g., at 100° to 200° C. for 0.5 to 1.0 hour) to obtain a cured coating film improved in various properties. The resist ink of the present invention is easily cured through irradiation thereof with ultraviolet light. The irradiation of the resist ink with ultraviolet light may be effected according to a customary method wherein use is made of, for example, a low-pressure or high-pressure mercury lamp, or a xenon lamp. The present invention also relates to a cured product as mentioned above. Examples of the substrate include flexible circuit boards having a copper foil adhered to a film such as a polyimide film; and rigid circuit boards such as a glass fiber-filled epoxy resin substrate having a copper foil adhered thereto, an aluminum substrate, and a ceramic substrate.

EXAMPLES

The following Examples will more specifically illustrate the present invention. Additionally stated, "part" or "parts" in Examples are part or parts by weight.

Synthesis Examples of Epoxy Resin (a) Represented by Formula (1)

Synthesis Example 1

371 parts of a bisphenol A epoxy resin having an average numerical value n of 3.3 in the formula (2), an epoxy equivalent of 650, a softening point of 81.1° C., and a melt viscosity (at 150° C.) of 12.5 P was dissolved in 925 parts of epichlorohydrin and 462.5 parts of dimethyl sulfoxide. Thereafter, 52.8 parts of 98.5% NaOH was added to the resulting solution under stirring at 70° C. over 100 minutes.

After the addition of NaOH, a reaction was further effected at 70° C. for 3 hours. Subsequently, the residue of the unreacted epichlorohydrin and the majority of dimethyl sulfoxide were distilled off under reduced pressure. Thereafter, the reaction product having a by-product salt and the remaining dimethyl sulfoxide was dissolved in 750 parts of methyl isobutyl ketone, and admixed with 10 parts of 30% NaOH to further effect the reaction at 70° C. for 1 hour.

After the completion of the reaction, the reaction mixture was washed twice with 200 g of water. After oil-water separation, methyl isobutyl ketone was distilled off from the resulting oil layer and recovered, while obtaining 340 g of an epoxy resin (a-1) having an epoxy equivalent of 287, a hydrolyzable chlorine content of 0.07%, a softening point of 64.2° C., and a melt viscosity (at 150° C.) of 7.1 P. The epoxy resin (a-1) thus obtained was such that about 3.1 of 3.3 alcoholic hydroxyl groups in the epoxy resin of the formula (2) were epoxidized when calculated from the epoxy equivalents of the two epoxy resins (both of the numbers are on the average, the same will apply hereinbelow).

Synthesis Example 2

Substantially the same procedure as in Synthesis Example 1 except that the amount of 98.5% NaOH used was 24.3 g was repeated to effect a reaction to thereby obtain 365 g of an epoxy resin (a-2) having an epoxy equivalent of 379, a hydrolyzable chlorine content of 0.067%, a softening point of 76.8° C., and a melt viscosity (at 150° C.) of 11.0 P. The epoxy resin (a-2) thus obtained was such that about 1.7 of 3.3 alcoholic hydroxyl groups in the epoxy resin of the formula (2) were epoxidized when calculated from the epoxy equivalents of the two epoxy resins.

Synthesis Example 3

Substantially the same procedure as in Synthesis Example 1 except that the amount of 98.5% NaOH used was 13.3 g was repeated to effect a reaction to thereby obtain 350 g of an epoxy resin (a-3) having an epoxy equivalent of 444, a hydrolyzable chlorine content of 0.054%, a softening point of 79.5° C., and a melt viscosity (at 150° C.) of 11.5 P. The epoxy resin (a-3) thus obtained was such that about 1.0 of 3.3 alcoholic hydroxyl groups in the epoxy resin of the formula (2) was epoxidized when calculated from the epoxy equivalents of the two epoxy resins.

Synthesis Examples of Unsaturated Group-Having Polycarboxylic Acid Resin (A)

Synthesis Example 4

2,870 parts (10 equivalents) of the epoxy resin (a-1) obtained in Synthesis Example 1, 720 parts (10 equivalents) of acrylic acid, 2.8 parts of methylhydroquinone, and 1943.5 parts of Carbitol acetate were charged, heated at 90° C., and stirred to effect dissolution of the reaction mixture. Subsequently, the liquid reaction mixture was cooled to 60° C., charged with 16.6 parts of triphenylphosphine, and then heated at 100° C. to effect a reaction for about 32 hours to thereby obtain a reaction product having an acid value of 1.0 mg·KOH/g. Subsequently, the reaction product was charged with 783 parts (7.83 mol) of succinic anhydride and 421.6 parts of Carbitol acetate, and heated at 95° C. to effect a reaction for about 6 hours. The reaction mixture was cooled to obtain a solution of an unsaturated group-having polycarboxylic acid resin (A-1) having an acid value (as solid) of 100 mg·KOH/g, a solid content of 65%, and a viscosity (at 25° C.) of 250 P.

Synthesis Example 5

3,650 parts (10 equivalents) of the epoxy resin (a-2) obtained in Synthesis Example 2, 720 parts (10 equivalents) of acrylic acid, 3.4 parts of methylhydroquinone, and 2,366 parts of Carbitol acetate were charged, heated at 90° C., and stirred to effect dissolution of the reaction mixture. Subsequently, the liquid reaction mixture was cooled, charged with 20.1 parts of triphenylphosphine, and then heated at 100° C. to effect a reaction for about 32 hours to thereby obtain a reaction product having an acid value of 1.0 mg·KOH/g. Subsequently, the reaction product was charged with 953 parts (9.5 mol) of succinic anhydride and 513 parts of Carbitol acetate, and heated at 95° C. to effect a reaction for about 6 hours. The reaction mixture was cooled to obtain a solution of an unsaturated group-having polycarboxylic acid resin (A-2) having an acid value (as solid) of 100 mg·KOH/g, a solid content of 65%, and a viscosity (at 25° C.) of 450 P.

Synthesis Example 6

4,440 parts (10 equivalents) of the epoxy resin (a-3) obtained in Synthesis Example 3,720 parts (10 equivalents) of acrylic acid, 4.0 parts of methylhydroquinone, and 2,794 parts of Carbitol acetate were heated at 90° C., and stirred to effect dissolution of the reaction mixture. Subsequently, the liquid reaction mixture was cooled, charged with 25.5 parts of triphenylphosphine, and then heated at 100° C. to effect a reaction for about 32 hours to thereby obtain a reaction product having an acid value of 1.0 mg·KOH/g. Subsequently, the reaction product was charged with 1,125 parts of succinic anhydride and 606 parts of Carbitol acetate, and heated at 95° C. to effect a reaction for about 6 hours. The reaction mixture was cooled to obtain a solution of an unsaturated group-having polycarboxylic acid resin (A-3) having an acid value (as solid) of 100 mg·KOH/g, a solid content of 65%, and a viscosity (at 25° C.) of 620 P.

Examples 1 to 3 and Comparative Examples 1 and 2

According to a formulation (numerical values are parts by weight) as shown in Table 1, all components were milled with a triple roll mill to prepare a photo-imaging resist ink. The whole surface of a copper-clad polyimide film substrate (copper thickness: 12 μm, polyimide film thickness: 25 μm) formed into a pattern was coated with the photo-imaging resist ink by screen printing while using a 100-mesh polyester screen to form a coating film having a thickness of 20 to 30 μm, which was then dried in a hot-air dryer at 80° C. for 30 minutes. Subsequently, a negative film having a resist pattern was brought into close contact with the dried coating film, which was then irradiated with ultraviolet light (quantity of exposure: 500 mJ/cm$^2$) while using an ultraviolet exposure apparatus Model HMW-680GW manufactured by Oak Co., Ltd. Subsequently, the coating film was developed with a 1% aqueous solution of sodium carbonate at a spray pressure of 2.0 kg/cm$^2$ for 60 seconds to dissolve away the unexposed portions thereof. The resulting product was evaluated with respect to developability and photosensitivity as will be described below. Thereafter, the product was heated and cured in the hot-air dryer at 150° C. for 40 minutes to obtain a test piece having a cured coating film. This test piece was tested with respect to adhesion, pencil hardness, solvent resistance, acid resistance, heat resistance, flex resistance, and folding resistance as will be described below. The results are shown in Table 1. The test methods and the evaluation methods are as follows.

(Developability)

The following ratings of evaluation were employed.

o . . . The ink could be perfectly removed and developed by development thereof.

Δ . . . A slight residue of the ink remained when it was developed.

x . . . An undeveloped portions of the ink remained when it was developed.

(Photosensitivity)

A step tablet with 21 steps (manufactured by Stauffer Chemical Co.) was brought into close contact with the dried coating film, which was then irradiated with, or exposed to, ultraviolet light (integrated quantity of light: 500 mJ/cm$^2$).

Subsequently, the coating film was developed with a 1% aqueous solution of sodium carbonate at a spray pressure of 2.0 kg/cm² for 60 seconds to confirm the number of step for the remaining undeveloped coating film. The following ratings of evaluation were employed.

o ... at least step 9.
Δ ... step 6 to 8.
x ... at most step 5.

(Adhesion)

In accordance with JIS K5400, 1-mm cross-cuts of 100 of the coating film were formed on the test piece, and then subjected to a peeling test with a Cellotape. The peeled state of the cross-cuts was observed, and evaluated according to the following ratings.

o ... not peeled with 100/100.
Δ ... 50/100 to 90/100.
x ... 0/100 to 50/100.

(Pencil Hardness)

It was evaluated according to JIS K5400.

(Solvent Resistance)

The test piece was immersed in isopropyl alcohol at room temperature for 30 minutes. After confirmation of whether or not something abnormal occurred in the appearance of the coating film, the test piece was subjected to a peeling test with a Cellotape, and evaluated according to the following ratings.

o ... Nothing abnormal occurred in the appearance of the coating film without blistering and peeling.
x ... The coating film was blistered and peeled.

(Acid Resistance)

The test piece was immersed in a 10% aqueous solution of hydrochloric acid at room temperature for 30 minutes. After confirmation of whether or not something abnormal occurred in the appearance of the coating film, the test piece was subjected to a peeling test with a Cellotape, and evaluated according to the following ratings.

o ... Nothing abnormal occurred in the appearance of the coating film without blistering and peeling.
x ... The coating film was blistered and peeled.

(Heat Resistance)

The test piece was coated with a rosin flux, and then immersed in a solder bath at 260° C. for 5 seconds. The foregoing procedure as one cycle was repeated three times (three cycles). The test piece was allowed to cool to room temperature, then subjected to a peeling test with a Cellotape, and evaluated according to the following ratings.

o ... Nothing abnormal occurred in the appearance of the coating film without blistering and peeling.
x ... The coating film was blistered and peeled.

(Flex Resistance)

It was evaluated according to JIS K5400. The test piece was used with a stem of 2 mm in diameter to observe whether or not the coating film was cracked.

(Folding Resistance)

It was evaluated according to JIS C5016. The curvature radius of the folded surface was set to be 0.38 mm. The number of times of folding was counted until the coating film was cracked.

TABLE 1

|  | Ex. | | | Comp. Ex. | |
| --- | --- | --- | --- | --- | --- |
|  | 1 | 2 | 3 | 1 | 2 |
| Unsaturated Group-having Polycarboxylic Acid Resin (A-1) Obtained in Synthesis Example 4 | 69 | | | | |
| Unsaturated Group-having Polycarboxylic Acid Resin (A-2) Obtained in Synthesis Example 5 | | 64 | | | |
| Unsaturated Group-having Polycarboxylic Acid Resin (A-3) Obtained in Synthesis Example 6 | | | 64 | | |
| KAYARAD ZBR- *1 | | | | 69 | |
| KAYARAD PCR- *2 | | | | | 64 |
| U-200AX *3 | | 5.0 | 5.0 | | 5.0 |
| M-325 *4 | | 3.5 | 3.5 | | 3.5 |
| KAYARAD DPHA *5 | 3.5 | | | 3.5 | |
| IRGACURE 907 *6 | 3.0 | 3.0 | 3.0 | 3.0 | 3.0 |
| KAYACURE DETX-S *7 | 0.5 | 0.5 | 0.5 | 0.5 | 0.5 |
| KAYACURE BMS *8 | 1.0 | 1.0 | 1.0 | 1.0 | 1.0 |
| R-1415-1 *9 | 10.0 | | | | |
| EXA-4800 *10 | | 10.0 | 10.0 | 10.0 | 10.0 |
| Dicyandiamide (epoxy-curing agent) | 0.5 | 0.5 | 0.5 | 0.5 | 0.5 |
| Silica (inorganic filler) | 10.0 | 10.0 | 10.0 | 10.0 | 10.0 |
| Phthalocyanine Green (pigment) | 0.5 | 0.5 | 0.5 | 0.5 | 0.5 |
| Aerosil #200 *11 | 1.0 | 1.0 | 1.0 | 1.0 | 1.0 |
| MODAFLOW *12 | 1.0 | 1.0 | 1.0 | 1.0 | 1.0 |
| Developability | o | o | o | Δ | o |
| Photosensitivity | o | o | o | x | o |
| Adhesion | o | o | o | o | o |

TABLE 1-continued

|  | Ex. | | | Comp. Ex. | |
| --- | --- | --- | --- | --- | --- |
|  | 1 | 2 | 3 | 1 | 2 |
| Pencil Hardness | 4H | 5H | 5H | 4H | 7H |
| Flex Resistance | not cracked | not cracked | not cracked | not cracked | cracked |
| Folding Resistance | at least 1,000 times | at least 1,000 times | at least 1,000 times | at least 1,000 times | once |
| Solvent Resistance | ○ | ○ | ○ | x | ○ |
| Acid Resistance | ○ | ○ | ○ | x | ○ |
| Hat Resistance | ○ | ○ | ○ | x | ○ |

Note)
*1) KAYARAD ZBR-: manufactured by Nippon Kayaku Co., Ltd., a reaction product of bisphenol A epoxy acrylate (manufactured by Yuka Shell Epoxy K.K., a reaction product of EPIKOTE 1004 with acrylic acid) with succinic anhydride, containing 24.5 wt. % of Carbitol acetate and 10.5 wt. % of solvent naphtha and having an acid value (as solid) of 100 mg · KOH/g.
*2) KAYARAD PCR-: manufactured by Nippon Kayaku Co., Ltd., a reaction product of phenolic novolak epoxy acrylate (manufactured by Nippon Kayaku Co., Ltd., a reaction product of EPPN-201 with acrylic acid) with succinic anhydride, containing 24.5 wt. % of Carbitol acetate and 10.5 wt. % of solvent naphtha and having an acid value (as solid) of 100 mg · KOH/g.
*3) U-200AX: manufactured by Shin-Nakamura Chemical Co., Ltd., a urethane acrylate.
*4) M-325: manufactured by Toagosei Chemical Industry Co., Ltd., caprolactone-modified tris (acryloxyethyl) isocyanurate.
*5) KAYARAD DPHA: manufactured by Nippon Kayaku Co., Ltd., a mixture of dipentaerythritol penta- and hexa-acrylates.
*6) IRGACURE 907: manufactured by CIBA-GEIGY Ltd., a photopolymerization initiator, 2-methyl-[4-(methylthio)phenyl]-2-morpholino-1-propanone.
*7) KAYACURE DETX-S: manufactured by Nippon Kayaku Co., Ltd., a photopolymerization initiator, 2,4-diethylthioxanthone.
*8) KAYACURE BMS: manufactured by Nippon Kayaku Co., Ltd., a photopolymerization initiator, 4-benzoyl-4'-methylphenyl sulfide.
*9) R-1415-1: manufactured by A.C.R. Co., Ltd., a rubber-modified epoxy resin.
*10) EXA-4800: manufactured by Dainippon Ink & Chemicals, Inc., a bisphenol S epoxy resin.
*11) Aerosil #200: manufactured by Nippon Aerosil Co., Ltd., anhydrous silica.
*12) MODAFLOW: manufactured by Monsanto Co., a leveling agent.

As is apparent from the results of evaluation as shown in Table 1, the resist inks according to the present invention were excellent in developability and photosensitivity, and the cure products thereof according to the present invention were excellent in flex resistance, folding resistance, solvent resistance, acid resistance, heat resistance, etc.

EFFECT OF THE INVENTION

In forming a solder resist pattern by exposing a coating film of a photo-imaging resist ink through a patterned film to ultraviolet light and developing the coating film to dissolve away the unexposed portions thereof, the photo-imaging resist ink of the present invention is excellent in developability and photosensitivity, while the cure product thereof is excellent in flex resistance and folding resistance, and well satisfactory in adhesion, pencil hardness, solvent resistance, acid resistance, heat resistance, etc. Accordingly, the resist ink of the present invention is especially suitable as a liquid solder resist ink for flexible printed circuit boards and thin pliable rigid circuit boards.

What is claimed is:

1. A photo-imaging resist ink containing (A) an unsaturated group-containing polycarboxylic acid resin which is a reaction product of (c) succinic anhydride with an additive reaction product of (a) an epoxy resin with (b) an unsaturated group-containing monocarboxylic acid, wherein (a) said epoxy resin is represented by the following formula (1):

(1)

wherein M stands for $$-CH_2-CH-CH_2;$$
$$\diagdown O \diagup$$

n is at least 1 on the average; and m is 1 to n on the average, wherein (A) said unsaturated group containing polycarboxylic acid resin is prepared by reacting (a) said epoxy resin with 0.8 to 1.3 mol, per equivalent of the epoxy groups of said epoxy resin, of (b) said unsaturated group containing monocarboxylic acid to form the said additive reaction product, and subsequently reacting said additive reaction product with 0.1 to 0.9 equivalent, per equivalent of the hydroxyl groups of said additive reaction product, of © succinic anhydride.

2. A photo-imaging resist ink as claimed in claim 1, wherein n is 1 to 10 on the average.

3. A photo-imaging resist ink as claimed in claim 1, wherein the acid value of (A) said unsaturated group-containing polycarboxylic acid resin is 40 to 110 mg·KOH/g.

4. A photo-imaging resist ink as claimed in claim 1, wherein the amount of (A) said unsaturated group-containing polycarboxylic acid resin is 10 to 80 wt. % based on the total amount of the resist ink.

5. A photo-imaging resist ink as claimed in claim 1, wherein (b) said unsaturated group-containing monocarboxylic acid is a member selected from the group consisting of acrylic acid, acrylic acid dimer, methacrylic acid, β-styrylacrylic acid, β-furfurylacrylic acid, crotonic acid, α-cyanocinnamic acid, cinnamic acid, half esters as reaction products of saturated or unsaturated dibasic anhydride with a (meth)acrylate compound having one hydroxyl group per molecule, half esters as reaction products of a saturated or unsaturated dibasic acid with an unsaturated group-containing monoglycidyl compound, and mixtures thereof.

6. A photo-imaging resist ink as claimed in claim 1, wherein (b) said unsaturated group-containing monocarboxylic acid is acrylic acid.

7. A photo-imaging resist ink comprising (A) an unsaturated group-containing polycarboxylic acid resin as claimed in claim 1, (B) a photopolymerization initiator, (C) a diluent, and (D) a curing component.

8. A photo-imaging resist ink as claimed in claim 1 or 7, which is a solder resist ink.

9. A cured product of a photo-imaging resist ink as claimed in claim 1 or 7.

10. A process for curing a photo-imaging resist ink, comprising coating a substrate with a photo-imaging resist ink as claimed in claim 1 or 7, and subsequently irradiating the coated surface of said substrate with ultraviolet light.

* * * * *